(12) United States Patent
Jones et al.

(10) Patent No.: US 10,215,618 B2
(45) Date of Patent: Feb. 26, 2019

(54) SEALABLE ROTATABLE PACKAGE WEIGHING AND LABELING SYSTEM AND APPARATUS

(71) Applicants: Billy R Jones, Glasgow, KY (US); Johnny V Jones, Crab Orchard, KY (US); Danny C Jones, Athens, AL (US); Darrin W Beardslee, Bowling Green, KY (US); Keaton G Dennis, Lancaster, KY (US)

(72) Inventors: Billy R Jones, Glasgow, KY (US); Johnny V Jones, Crab Orchard, KY (US); Danny C Jones, Athens, AL (US); Darrin W Beardslee, Bowling Green, KY (US); Keaton G Dennis, Lancaster, KY (US)

( * ) Notice: Subject to any disclaimer, the term of this patent is extended or adjusted under 35 U.S.C. 154(b) by 169 days.

(21) Appl. No.: 15/291,065

(22) Filed: Oct. 11, 2016

(65) Prior Publication Data

US 2017/0102262 A1    Apr. 13, 2017

Related U.S. Application Data

(60) Provisional application No. 62/239,967, filed on Oct. 11, 2015.

(51) Int. Cl.
| | | |
|---|---|---|
| *G01G 21/28* | (2006.01) | |
| *G01G 19/415* | (2006.01) | |
| *B65C 9/26* | (2006.01) | |
| *H05K 5/06* | (2006.01) | |
| *B65C 9/18* | (2006.01) | |
| *B65C 9/28* | (2006.01) | |
| *B65C 9/42* | (2006.01) | |
| *G01G 19/414* | (2006.01) | |
| *G01G 23/38* | (2006.01) | |
| *G06Q 10/08* | (2012.01) | |

(Continued)

(52) U.S. Cl.
CPC ............. *G01G 19/415* (2013.01); *B65C 9/18* (2013.01); *B65C 9/262* (2013.01); *B65C 9/28* (2013.01); *B65C 9/36* (2013.01); *B65C 9/42* (2013.01); *B65C 9/46* (2013.01); *G01G 19/4144* (2013.01); *G01G 21/28* (2013.01); *G01G 23/38* (2013.01); *G06Q 10/087* (2013.01); *H05K 5/06* (2013.01)

(58) Field of Classification Search
CPC .. G01G 21/28; G01G 19/415; G01G 19/4144; G01G 23/38; G01G 11/003; G01G 11/04; G01G 15/00; B65C 9/18; B65C 9/28; B65C 9/42; B65C 9/262; B65C 9/36; B65C 9/46; G06Q 10/087; H05K 5/06
See application file for complete search history.

(56) References Cited

U.S. PATENT DOCUMENTS 2,572,617 A * 10/1951 Haury Paul T .......... H05K 7/16
                                                   211/90.01
3,878,909 A *  4/1975 Treiber ................... B65B 35/20
                                                      177/145

(Continued)

*Primary Examiner* — Randy Gibson
(74) *Attorney, Agent, or Firm* — Brian W. Foxworthy; Robert R. Waters; Waters Law Group, PLLC

(57) ABSTRACT

A weighing and labeling system has a scale, label printer, and at least one controller. The controller stores information about incoming food packages and drives the printer to produce labels based on the stored information and the weight of the food packages. The labels are transferred to the food packages.

7 Claims, 15 Drawing Sheets

(51) Int. Cl.
    *B65C 9/36* (2006.01)
    *B65C 9/46* (2006.01)

(56) References Cited

U.S. PATENT DOCUMENTS

| | | | | |
|---|---|---|---|---|
| 3,955,665 A | * | 5/1976 | Pettis, Jr. | G01G 15/00 177/145 |
| 4,229,794 A | | 10/1980 | Foster | |
| 4,337,108 A | * | 6/1982 | Crankshaw | B65C 9/1884 156/235 |
| 4,415,048 A | * | 11/1983 | Teraoka | B65C 1/02 177/245 |
| 4,423,486 A | | 12/1983 | Berner | |
| 4,625,731 A | * | 12/1986 | Quedens | A61B 6/447 348/825 |
| 4,683,707 A | | 8/1987 | Koyama | |
| 4,691,290 A | * | 9/1987 | Griffen | G01G 3/1414 177/25.13 |
| 5,129,397 A | * | 7/1992 | Jingu | A61B 8/00 248/581 |
| 6,050,658 A | * | 4/2000 | O'Sullivan | G06F 1/184 312/223.1 |
| 7,531,758 B2 | * | 5/2009 | Grove | G01G 11/003 177/119 |
| 7,626,130 B2 | * | 12/2009 | Scholpp | G01G 15/00 177/238 |
| 8,716,611 B2 | * | 5/2014 | Schon; Thomas | G01G 21/28 174/50 |
| 9,091,587 B2 | | 7/2015 | Kawamura | |
| 2003/0035265 A1 | * | 2/2003 | DeLuga | G06F 1/1616 361/679.58 |
| 2010/0101871 A1 | * | 4/2010 | Dale | G01G 15/006 177/1 |
| 2014/0014264 A1 | * | 1/2014 | Bixen | B65C 9/28 156/285 |

* cited by examiner

SEALABLE ROTATABLE PACKAGE WEIGHING AND LABELING SYSTEM AND APPARATUS

This application claims the priority benefit of U.S. Provisional Patent Application Ser. No. 62/239,967, "Package Weighing and Labeling System and Apparatus," filed Oct. 11, 2016, which is hereby expressly incorporated by reference herein in its entirety.

FIELD OF THE INVENTION

This invention relates generally to package weighing and labeling. More specifically, this invention relates to a system and apparatus for weighing and labeling packages of various types of meats.

BACKGROUND OF THE INVENTION

In modern food production, meats of various types are prepackaged, labeled, and offered for sale to consumers. This offers convenience to consumers, allowing them to survey packages of meats and see the cuts, the weights, and the prices without requiring assistance. For many consumers this is preferable to asking for assistance, specifying what is desired, and waiting for completion service. The prepackaging of meats is also monetarily more efficient as well. It is generally preferred to buy prepackaged meat for convenience and price.

Prepackaging of meats leads to many efficiencies. Many of these efficiencies result from the disassembly line production of the meat packages. Among the steps in producing these packages are the final steps of weighing and labeling the packages. Among the important information provided by a label are the weight, cut of meat, and the actual price of each package of meat. Meat is generally priced by the quantity of meat in the package. However, the price per unit weight of meat is dependent upon the type of meat and the specific cut of meat in the package. For example, for poultry, the price per unit weight of poultry thigh will be different from the price per unit weight of poultry wing. With regard to beef, the price per unit weight will vary between sirloins, tenderloins, briskets, roasts, etc. Additionally, it has become more desirable to be able to identify the source of the meat purchased by the customer. This may be for health reasons, i.e. to track illness outbreaks to the source. It may also be for consumer preferences, i.e. to identify a source as an organic producer, etc.

Hence, it is very important that label provide the relevant information which may include the type of meat, the cut, the weight, the price, and sometimes the source. However, it is the nature of the disassembly line that the various steps in the process occur at different locations. Sometimes these locations are far removed from each other. Additionally, the knowledge possessed by persons working at different locations in the process may not encompass the knowledge possessed at other locations. This means that it is highly desirable to be able to automatically track the type of meat and cuts arriving at weighing and labeling locations toward the end of the process.

SUMMARY OF THE INVENTION

Embodiments of the apparatus of the present invention comprise a frame upon which other, functional, elements are mounted. Embodiments of the apparatus comprise various functional elements which may include: a scale; a label printer; a label feeder; a label applicator; and, a controller for operating and coordinating the various other elements of the apparatus along with communicating with other elements, controllers, or stations within the meat processing plant. The apparatus may have elements that are electrically powered or air driven.

The scale is located at the front of the apparatus and is positioned at the suitable ergonomic height. This allows an operator to load and unload the scale with packages of meat. In one embodiment, the controller for the scale is located below the scale and has a display and controls on the front to set up and program the scale; in an alternative embodiment, the controller for the scale is located above the scale on the internal surface of the door of the water-tight first printer housing. The platform on which the scale sets is capable of up and down adjustment to adjust the vertical space between the scale and the label applicator (and therefore the space between the label applicator and a package on the scale). A label applicator is located above the scale.

A label printer is located on the side of the apparatus. A label feeder feeds a label ribbon to the printer and on to the label applicator. The label feeder breaks printed labels away from the label ribbon and the label applicator acquires the printer labels from the ribbon. The label is then applied to a package, either automatically by the label applicator or manually by an operator. The operator removes the package and usually packs it into a larger carton.

A controller on the weighing and labeling apparatus is programmable either locally manually or from a distance by the planning system of the larger packing plant. An operator places a package on the scale. The weight of the package is communicated to the controller and the required information is transmitted to the label printer. A label is printed and advanced to the label applicator.

In one embodiment, a water-tight housing is mounted on a rotatable mast supported by a riser. The water-tight configuration of the printer housing can be beneficial for cleaning the weighing and labeling apparatus' surfaces without causing damage to a printer or labeling element located within printer housing. The printer housing is made water-tight by gaskets located on the internal surfaces of the printer housing doors when the doors are maintained in a closed configuration via door fasteners located on each door.

At least one rotatable mast is mounted on a riser which supports one or more printer housings located above the scale on the weighing and labeling apparatus' frame. The rotatable mast enables a printer housing to swivel or pivot via a bolt-on, hollow tube covering a shaft with a bolt connecting the bottom of the mast to a swivel-plate on the top of the mast. The swiveling aspect of the printer housing enables an operator to easily access the printer and labeling elements located within the printer housing. The printer housing is mounted on top of the swivel-plate at the head of mast and the bottom of the tube connects to the riser supporting the rotatable mast.

The printer housing has at least two doors that have internal surfaces. Located on the internal surfaces of each door are gaskets for sealing the doors in a water-tight configuration when maintained in a closed position via the door fasteners affixed to each door. Each door on the printer housing is further configured to be propped open during the weighing and labeling apparatus' operation by door latches located on the external surfaces of each door. Also mounted on the internal surfaces of the doors are the computer and controller of the weighing and labeling apparatus. A controller is capable of being programmed to communicate with the computer, which in turn communicates with the printer and the scale and coordinates the various other elements of weighing and labeling apparatus and with other elements and stations within the meat processing plant. A controller on the weighing and labeling apparatus is programmable either locally manually or from a distance by the planning system of the larger packing plant.

DETAILED DESCRIPTIONS OF THE EMBODIMENTS

Figure 1:
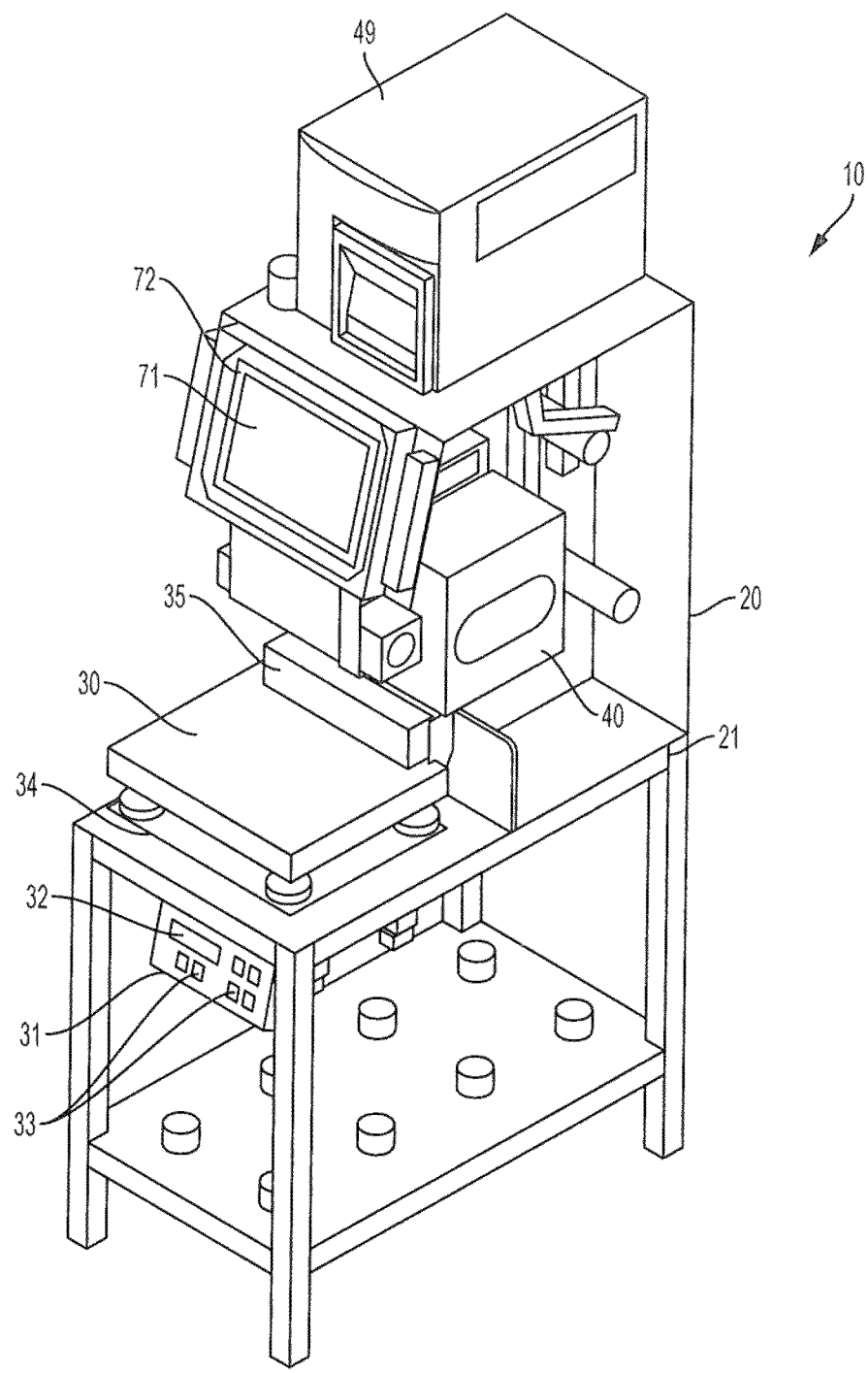
FIG. 1 is a right perspective view of an embodiment of the weighing and labeling apparatus.
Figure 2:
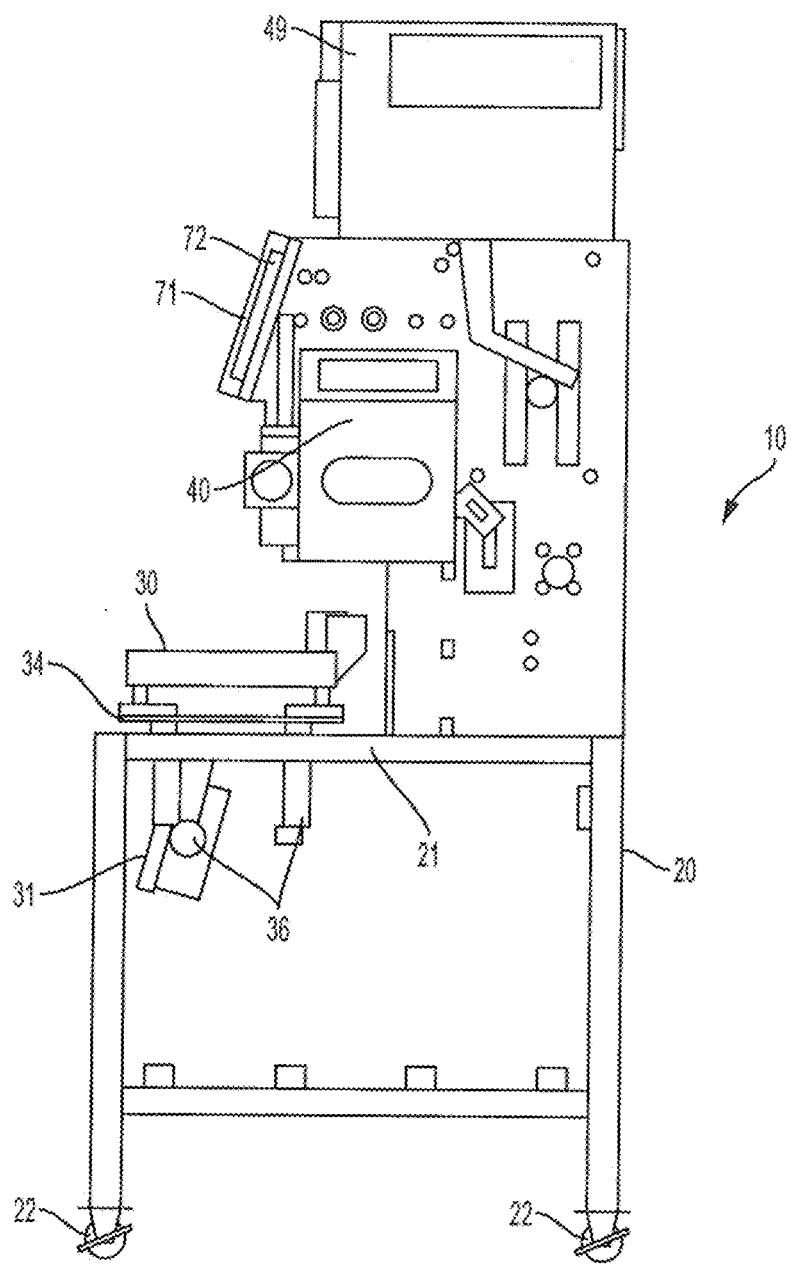
FIG. 2 is a right side view of the embodiment of the weighing and labeling apparatus of FIG. 1.
Figure 3:
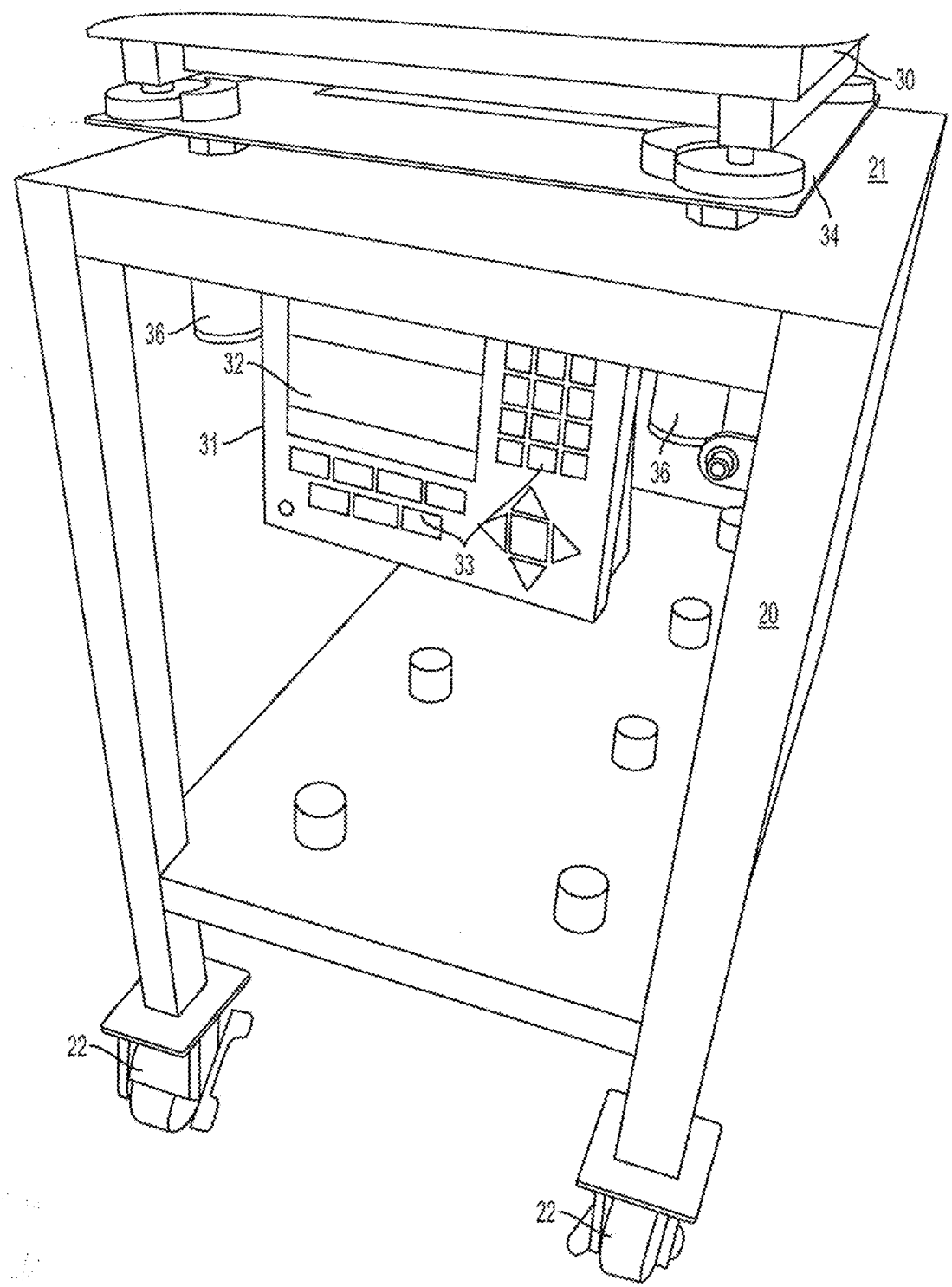
FIG. 3 is a front perspective view of the scale controller and scale platform of an embodiment of a weighing and labeling apparatus.

FIG. 1 is a right perspective view of an embodiment of the weighing and labeling apparatus 10. FIG. 2 is a right side view of the embodiment of the weighing and labeling apparatus 10 of FIG. 1. Frame 20 supports scale 30, label printer 40, label feeder 50, label applicator 60, and controller 70. Controller 70 communicates with and coordinates the various other elements of weighing and labeling apparatus 10 and also communicates with other elements and stations within the meat processing plant.

Scale 30 is located at the front of weighing and labeling apparatus 10 and is positioned at the suitable ergonomic height. This allows an operator to load and unload scale 30 with packages of meat. Scale controller 31 is located below scale 30 and has scale display 32 and scale controls 33 on the front to set up and program scale 30.

Scale 30 sits on platform 34 beneath label applicator 60. In the embodiment of weighing and labeling apparatus 10 shown in FIGS. 1 and 2, platform 34 is capable of up and down adjustment to adjust the vertical space between scale 30 and the label applicator 60. Platform cylinders 36 are mounted to scale deck 21 of frame 20. The cylinder rods of platform cylinders 36 are attached to platform 34 and provide the adjustment to the height of platform 34. The ability to adjust vertical space between scale 30 and label applicator 60 allows packages of different heights to be placed on scale 30 and have their top surfaces be at the same level. This places the top surface of packages at the same height with respect to label applicator 60 and avoids the need to adjust the stroke length of label applicator 60. Other embodiments of weighing and labeling apparatus 10 may make this adjustment by adjusting the stroke of label applicator 60.

Spacer 35 at the back edge of scale 30 provides a locator against which packages are placed. Spacer 35 is adjustable. Adjusting spacer 35 results in adjusting the front-to-back position of a package placed on scale 30, which, in turn, determines where the package is positioned with respect to label applicator 60.

Figure 4:
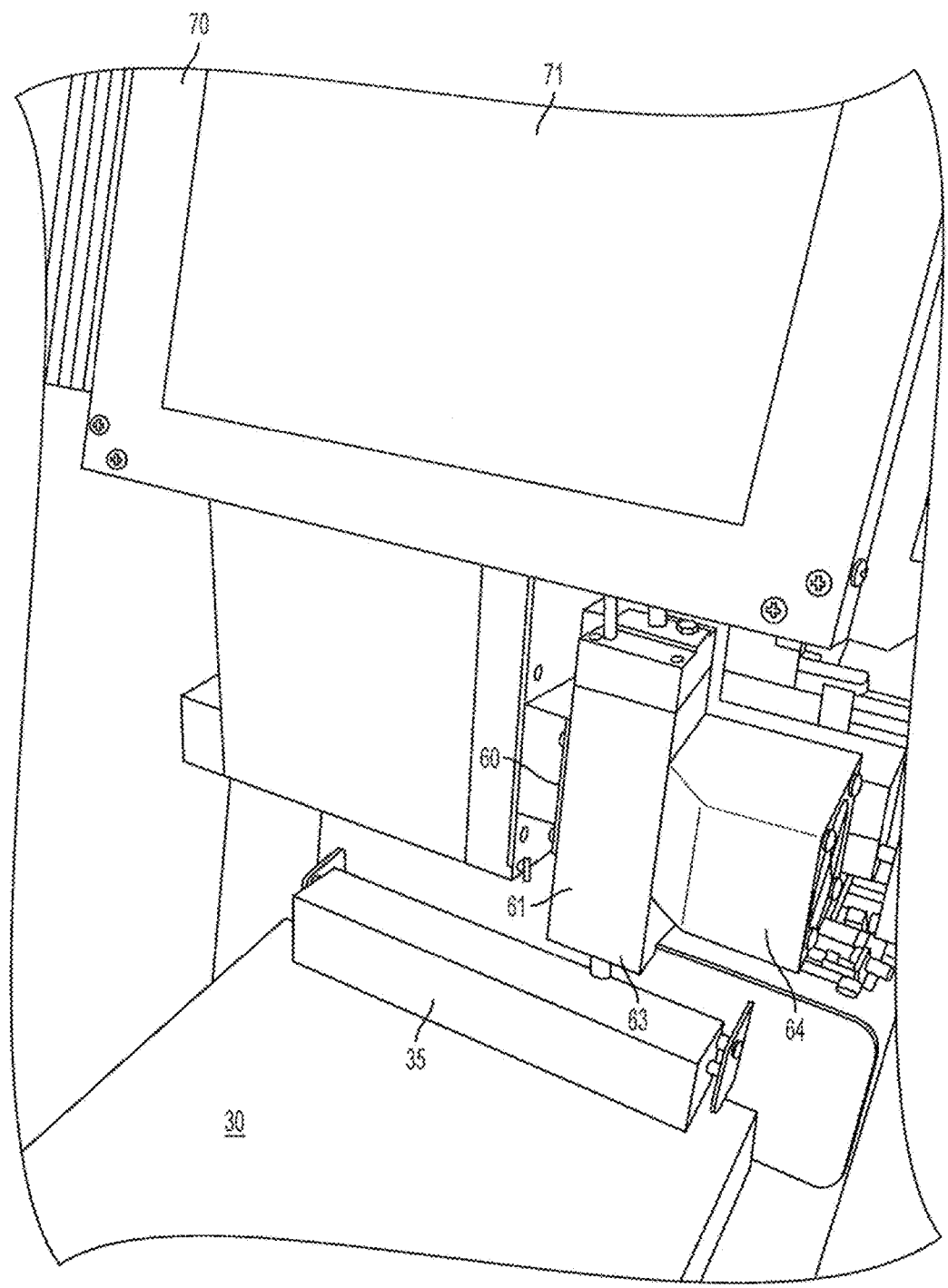
FIG. 4 is a front perspective view of a scale, computer, computer display, and label applicator of an embodiment of a weighing and labeling apparatus.
Figure 5:
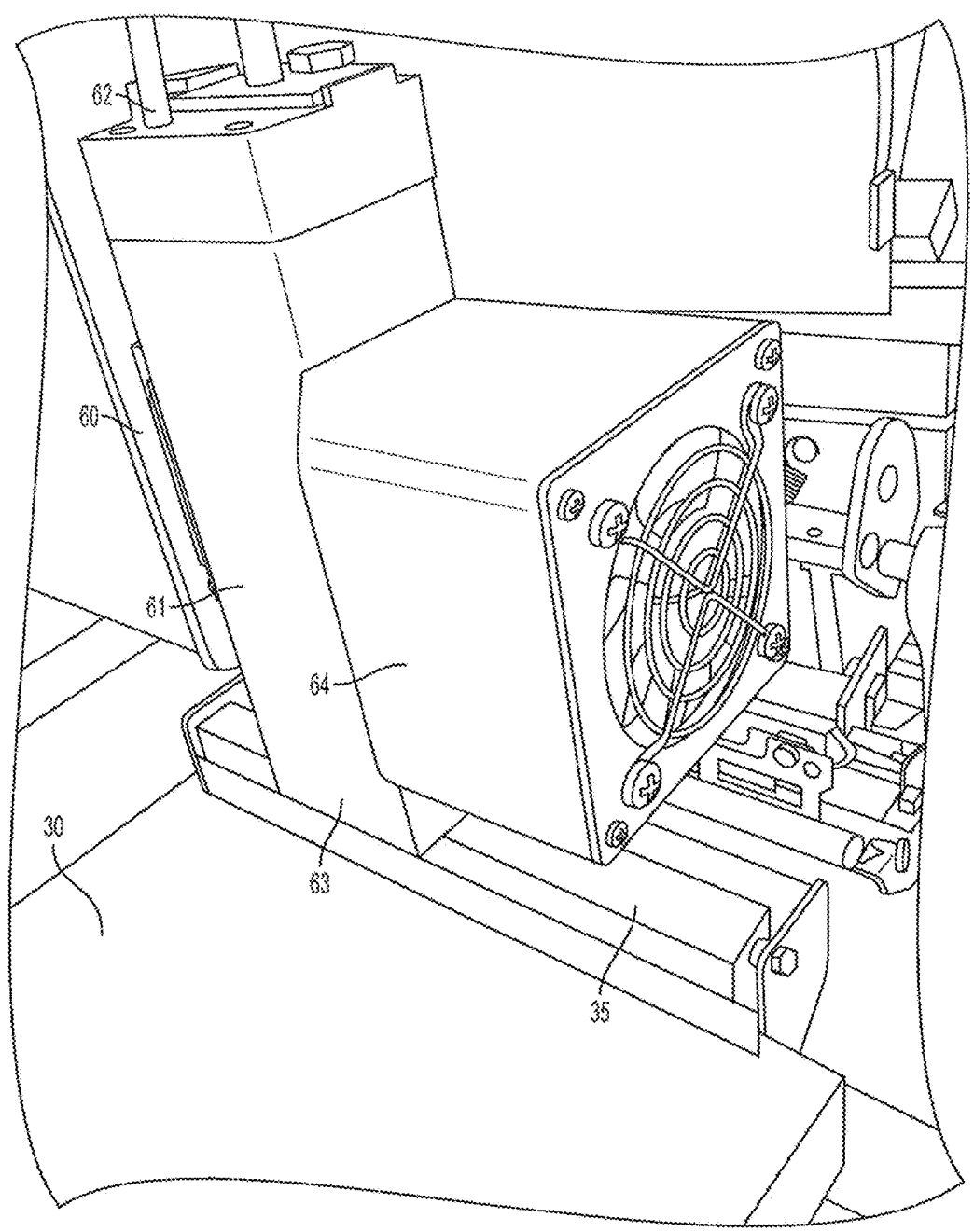
FIG. 5 is a front perspective view of a label applicator and fan of an embodiment of a weighing and labeling apparatus.

FIG. 4 is a front perspective view of scale 30 and label applicator 60 of an embodiment of a weighing and labeling apparatus 10. FIG. 5 is a front perspective view of label applicator 60 and suction fan 64 of an embodiment of weighing and labeling apparatus 10. Referring to FIG. 4, label applicator 60 is located to the rear of scale 30 and slightly offset from center. Referring to FIGS. 4 and 5, label applicator housing 61 contains an applicator cylinder 62 and terminates at its bottom at label pick-up face 63. Suction fan 64 extends from label applicator housing 61. Suction fan 64 draws air through label pick-up face 63 via label applicator housing 61 of label applicator 60. This maintains a slight vacuum effect at label pick-up face 63 above scale 30 and spacer 35.

Figure 6:
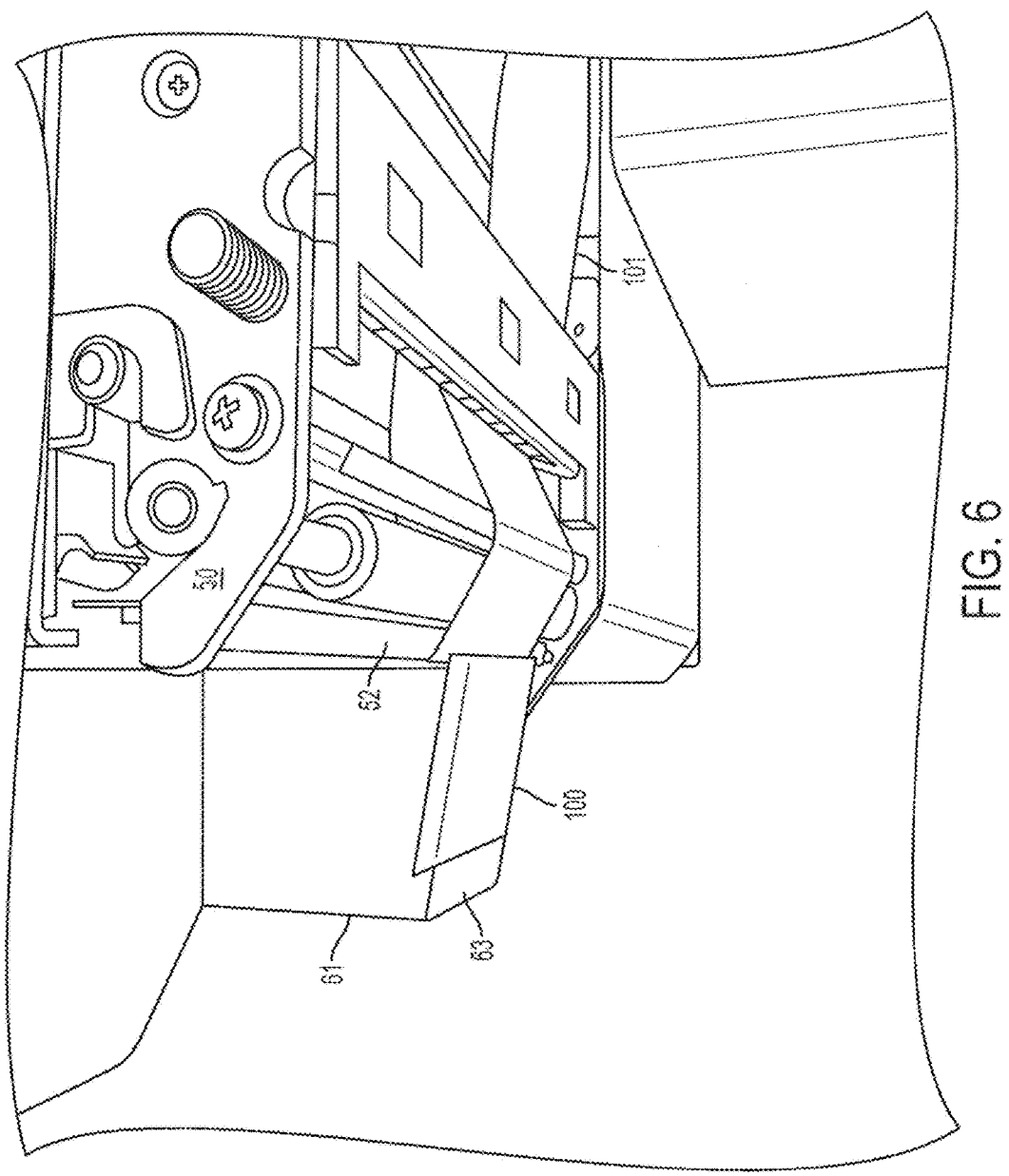
FIG. 6 is a bottom perspective view of a label applicator and label feeder of an embodiment of a weighing and labeling apparatus.

FIG. 6 is a bottom perspective view of label applicator 60 and label feeder 50 of an embodiment of weighing and labeling apparatus 10. Label feeder 50 delivers printed labels 100 to label pick-up face 63. When a label 100 is printed and label feeder 50 delivers a label at label pick-up face 63 the vacuum captures the label on label pick-up face 63. Once label 100 is captured at label pick-up face 61, it may be applied to the package using one of three different methods available to the operator. In a first method, applicator cylinder 62 cycles and pushes label 100 from the label pick-up face 63 onto the package. In a second method, an operator may lift the package up to the label pick-up face 63 to transfer label 100 to the package. In a third method, an operator may manually take label 100 from label pick-up face 61 and apply it to the package. Referring to FIG. 6 for this last method, label 100 hangs a little off to the side from label pick-up face 63 which provides a tab for an operator to easily grasp label 100.

Figure 7:
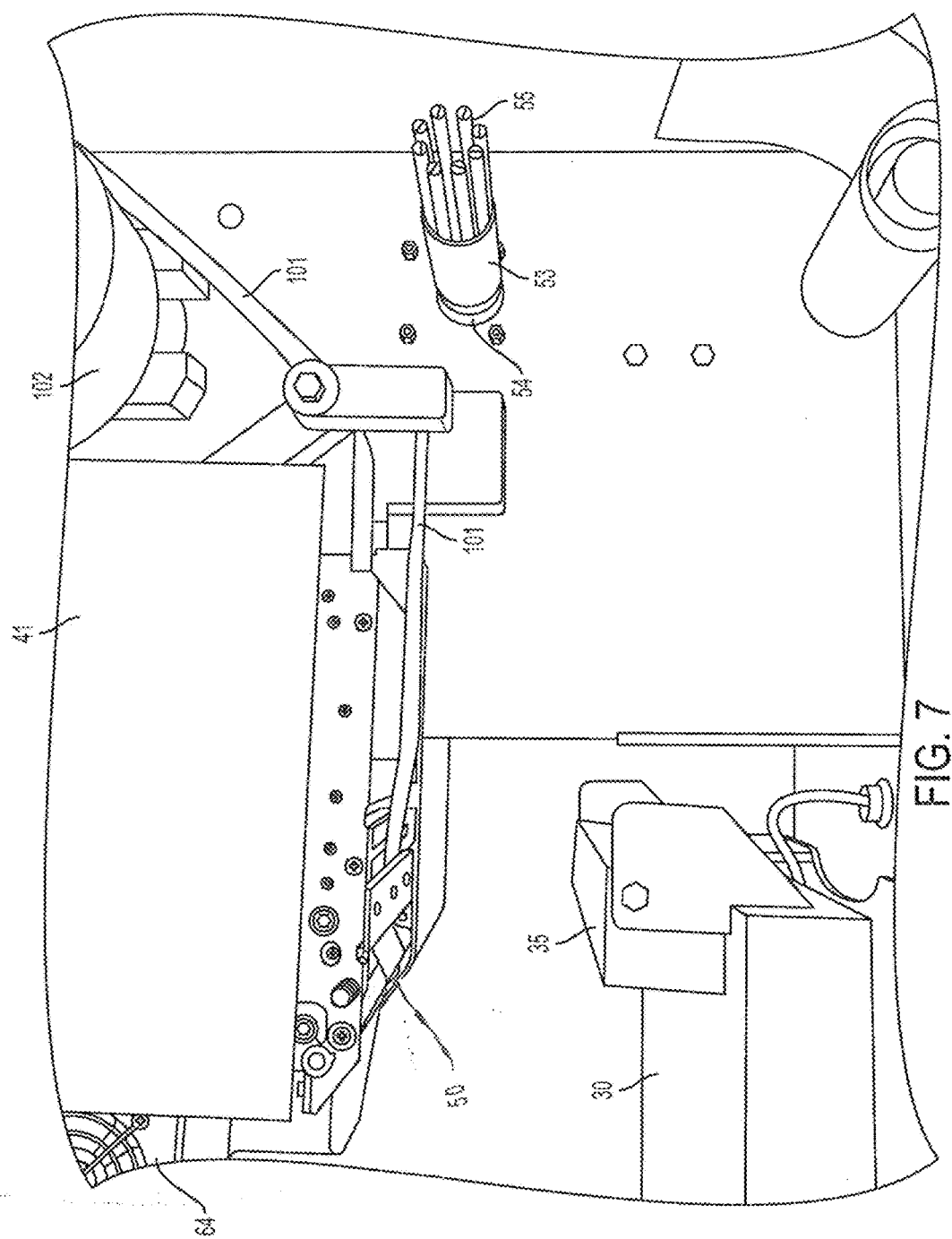
FIG. 7 is a lower side perspective view of a printer and label feeder of an embodiment of a weighing and labeling apparatus.
Figure 8:
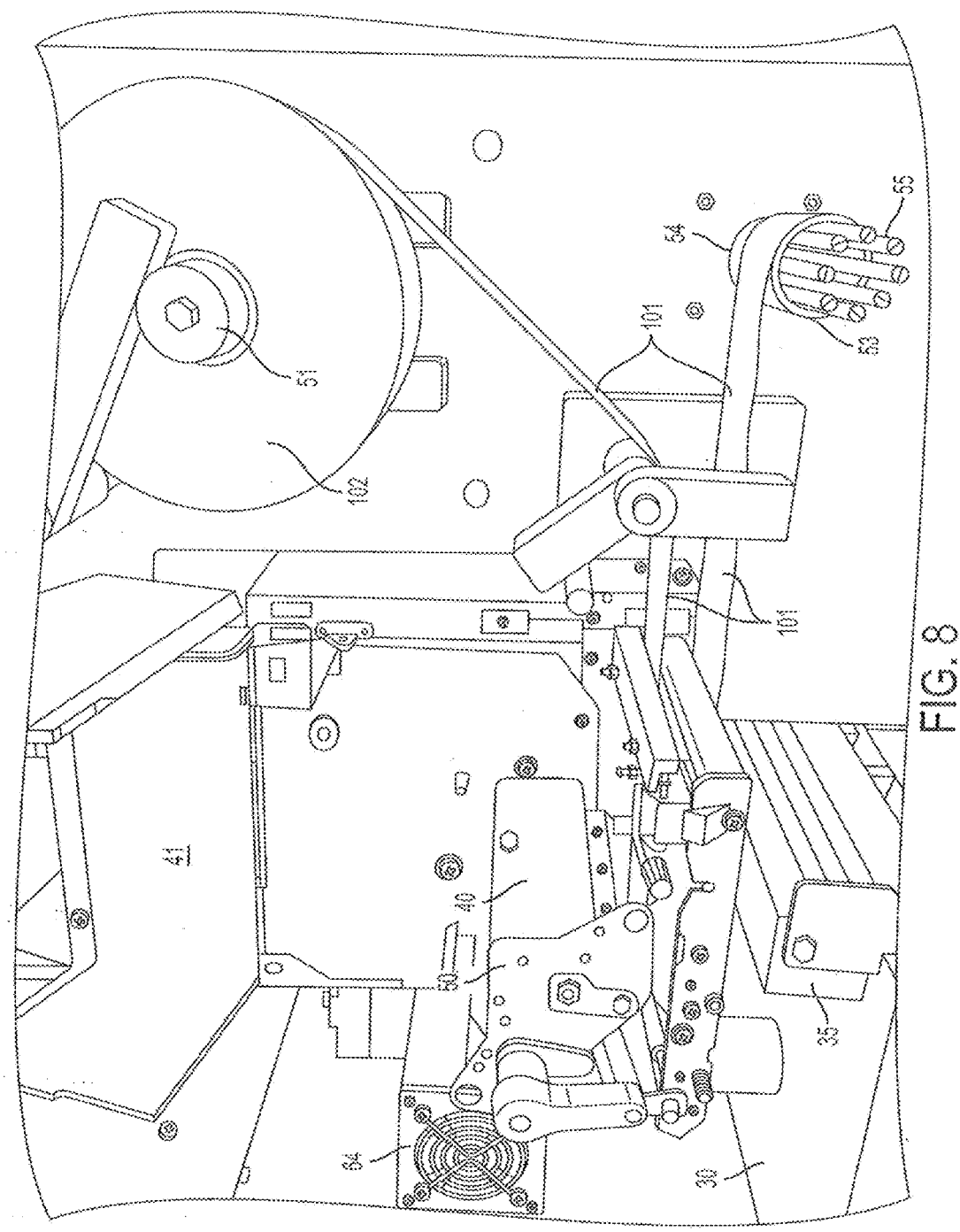
FIG. 8 is a rear side perspective view of a printer and label feeder of an embodiment of a weighing and labeling apparatus with the side door opened.

FIG. 7 is a lower side perspective view of printer 40 and label feeder 50 of an embodiment of weighing and labeling apparatus 10. FIG. 8 is a rear side perspective view of printer 40 and label feeder 50 of an embodiment of weighing and labeling apparatus 10 with side door 41 opened. Referring to FIGS. 6, 7, and 8, the entire path of label ribbon 101 may be observed. To the right in FIGS. 7 and 8, label roll 102 mounts on feed spindle 51 feeds into printer 40. At the left in FIG. 6, label ribbon 101 breaks back sharply over peel bar 52. This causes label 100 to separate from label ribbon 101, which allows pick-up face 63 of label applicator 60 to acquire label 100. Label ribbon 101 returns along the bottom of printer 40 and label feeder 50 to take-up spindle 53 at the right in FIGS. 7 and 8.

Referring to FIGS. 7 and 8, take-up spindle 53 comprises hub 54 with prongs 55 extending from it. In the embodiments shown in FIGS. 7 and 8, take-up spindle 53 has 8 prongs. Label ribbon 101 wraps into prongs 55 and take-up spindle 53 is powered and turns to draw label ribbon 101 through printer 40. The open configuration of prongs 55 makes it easy to set up label feeder 50.

Returning to FIGS. 1, 2 and 4, controller display 71 is located on the front of computer 72 and package weighing and labeling apparatus 10 and controller 70 (not shown) is located in computer 72. Controller display 71 provides an interface with controller 70. Controller 70 coordinates the operation of the several elements of weighing and labeling apparatus 10. Controller 70 also communicates with other stations and other areas of the plant. This allows the greater plant to communicate operations information to weighing and labeling apparatus 10. This prevents the need for changes to be made manually at local stations and prevents errors.

FIGS. 1 and 2 also show carton printer 49. As packages are weighed and labeled, they are removed from scale 30 and placed into larger cartons. Carton printer 49 prints labels to be printed for placement onto the larger cartons. Carton printer 49 receives information from controller 70, which in turn may come from the greater plant planning system.

Figure 9:
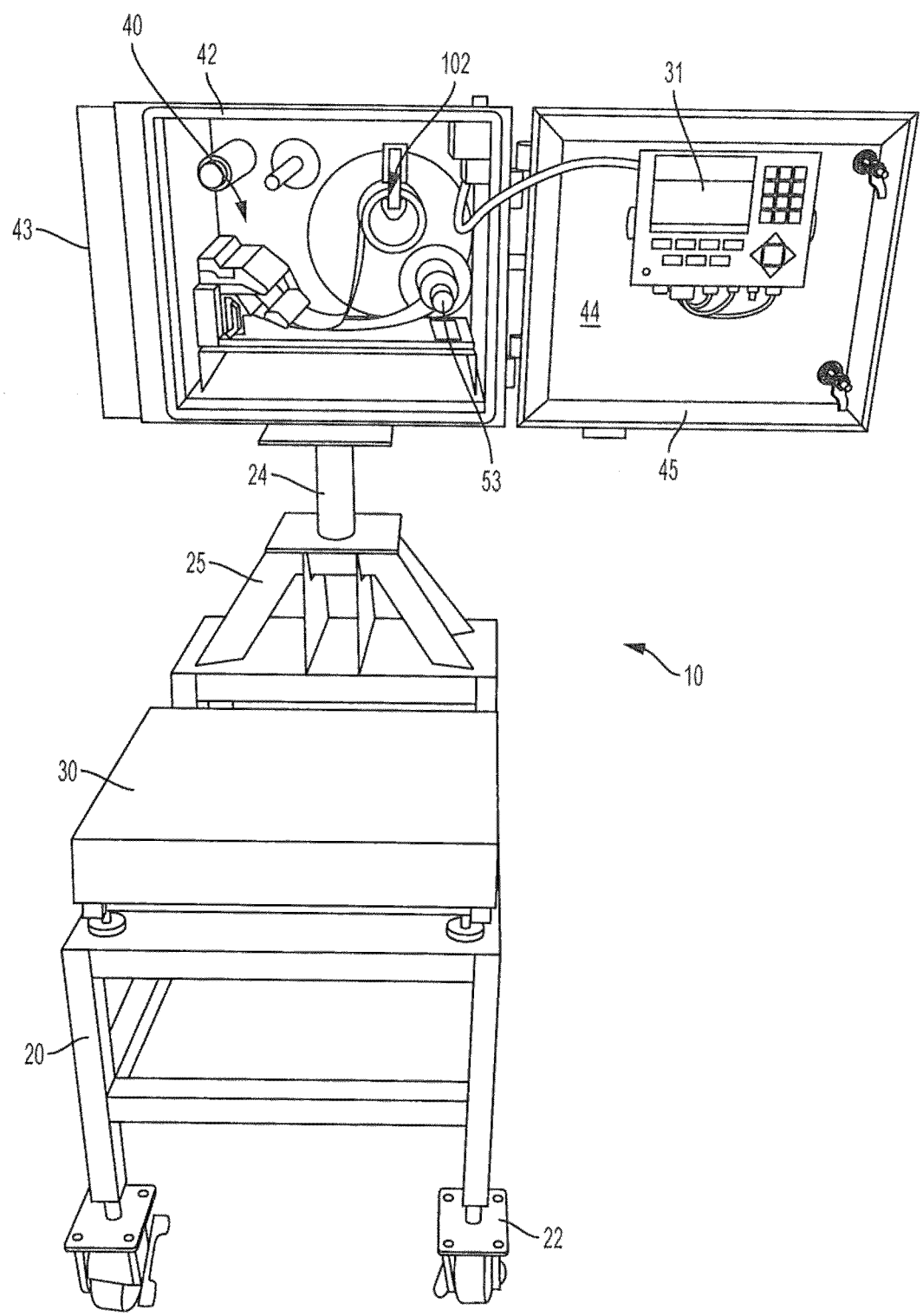
FIG. 9 is a front perspective view of an embodiment of the weighing and labeling apparatus with riser and rotatable, water-tight printer housing with one side door opened.

FIG. 9 shows a front perspective view of an embodiment of the weighing and labeling apparatus with riser 25 and rotatable mast 24, supporting water-tight printer housing 42. FIG. 9 also shows side door 44 in an opened configuration, and side door 43 in a closed configuration. Label printer 40, located within water-tight printer housing 42, shows label roll 102, take-up spindle 53, and scale controller 31 mounted on an internal surface of door 44. Also shown in FIG. 9 is a gasket 45 for creating a water-tight seal on door 44 and door 43 when the doors are in a closed configuration. Rotatable mast 24 allows an operator to swivel or turn housing 42 in order to conveniently install label tape or change any of the label printer 40 applications. Label printer 40 receives information from controller 31 in order to print labels displaying package information such as package contents, package weight, package price per unit, package sell-by date information, and package vendor information. Controller 31 also communicates with other stations and other areas of the plant.

Figure 10:
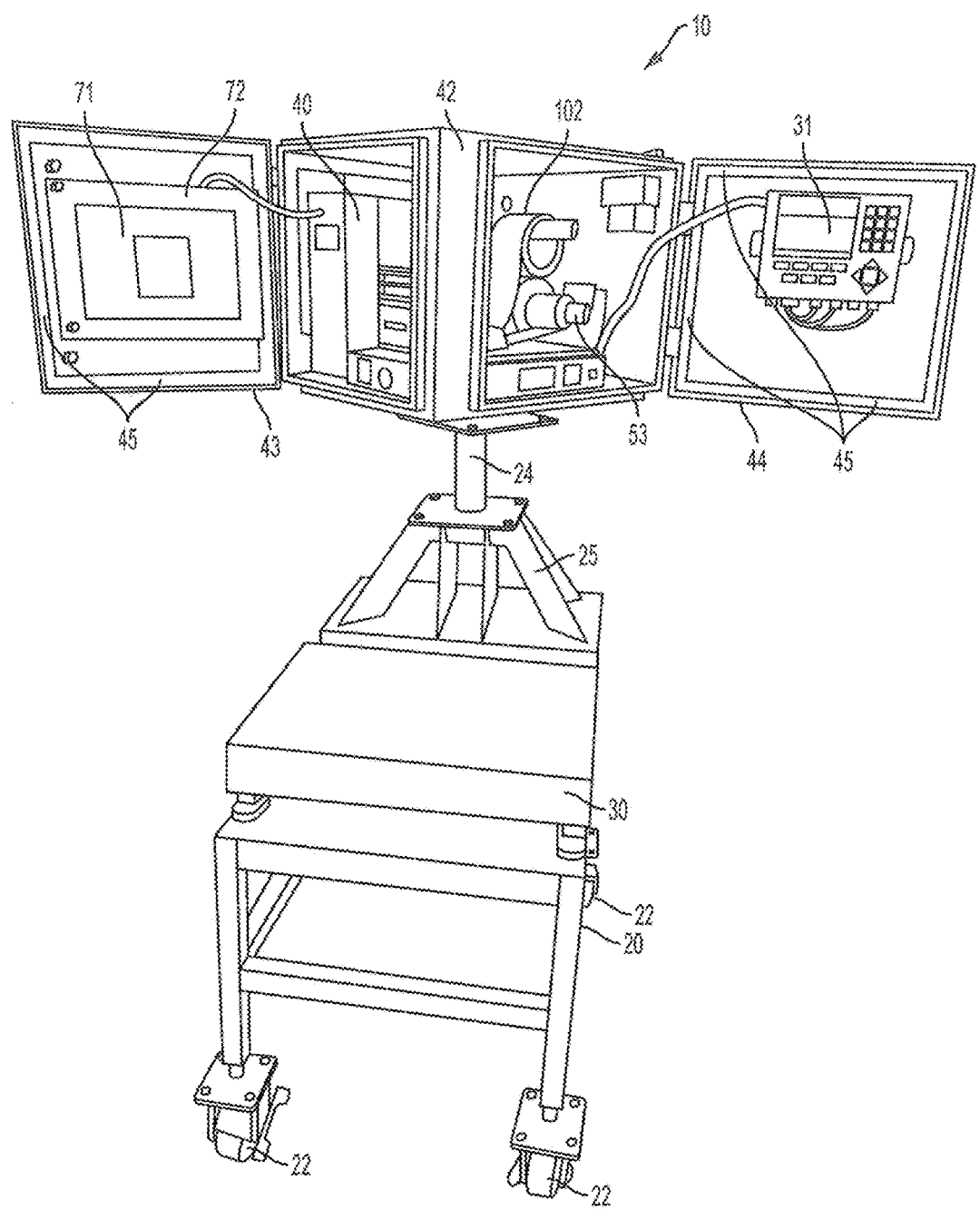
FIG. 10 is a front perspective view of an embodiment of the weighing and labeling apparatus with riser and rotatable, water-tight printer housing with two side doors opened.

FIG. 10 is a front perspective view of an embodiment of the weighing and labeling apparatus with riser 25 and rotatable mast 24, water-tight printer housing 42 with door 43 and door 44 in an opened configuration, supported by frame 20 which rests on wheels 22. Scale 30 is located on the front of frame 20 below water-tight printer housing 42. Located on the internal surface of door 43 is computer tablet 72 with display 71 and inner gasket 45, forming a water-tight seal on door 43 when door 43 is in a closed configuration. Located on the internal surface of door 44 is scale controller 31 with inner gasket 45, forming a water-tight seal on door 44 when door 44 is in a closed configuration. Controller 31 coordinates the operation of the several elements of weighing and labeling apparatus 10 in conjunction with computer 72. Controller 31 also may communicate with other stations and other areas of the plant.

Figure 11:
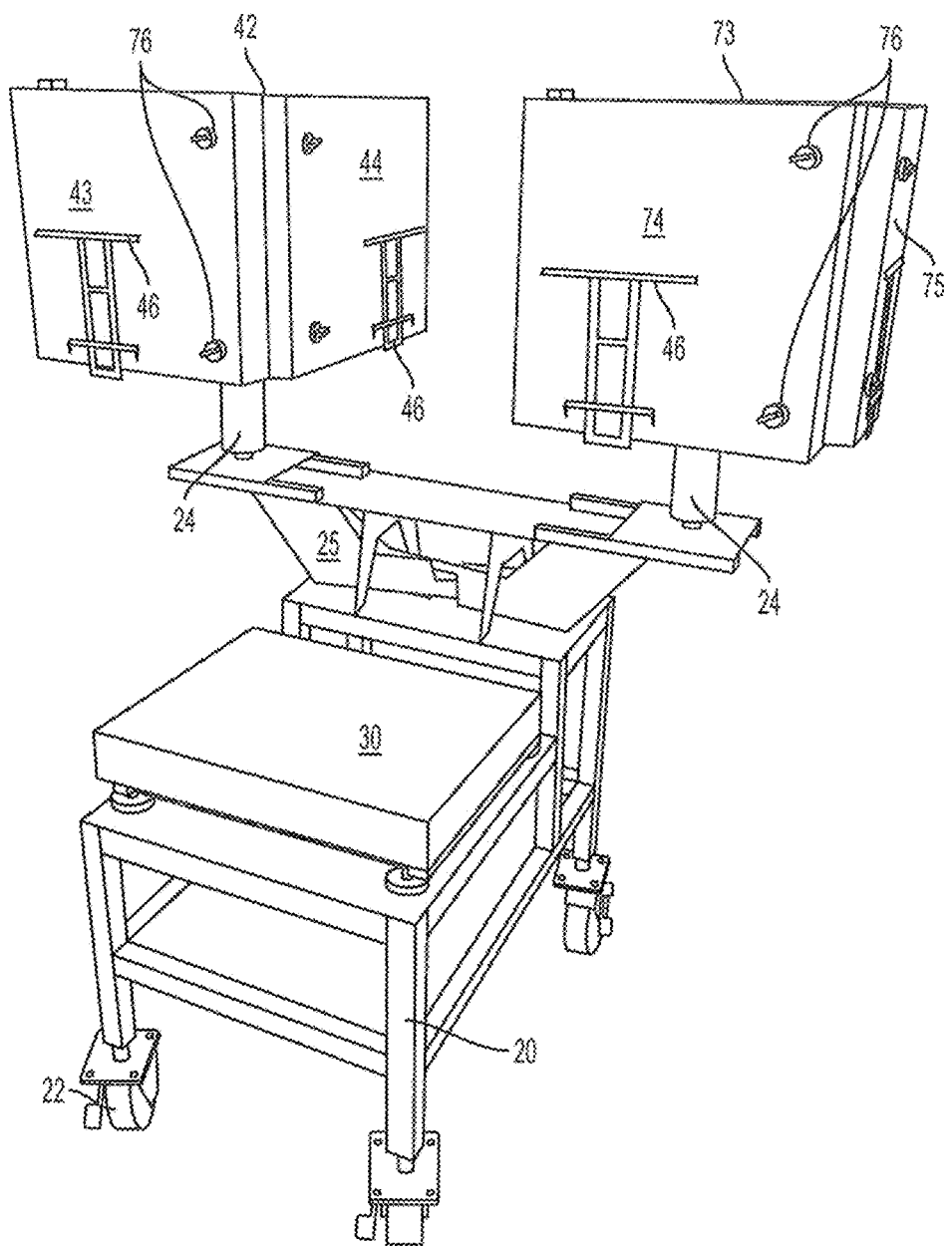
FIG. 11 is a front perspective view of an embodiment of the weighing and labeling apparatus with riser and dual rotatable, water-tight printer housings with side doors closed.

FIG. 11 is a front perspective view of an embodiment of the weighing and labeling apparatus with riser 25 supporting dual rotatable masts 24 and water-tight printer housings 42 and 73 with side door 43, door 44, door 74, and door 75 in a closed configuration. Door 43, door 44, door 74 and door 75 show door latch 46 which is configured to maintain doors of housing 42 and housing 73 in an open configuration. Door fasteners 76 are located on doors 43, 44, 74 and 75 to maintain doors 43, 44, 74 and 75 in a closed configuration. When the doors of printer housing 42 and 73 are fastened closed with door fasteners 76, they are in a water-tight configuration which can be beneficial for cleaning the printer housing surfaces without causing damage to printer 40 and computer 72 and controller 31 located within printer housing 42 and printer housing 73. Controller 31 coordinates the operation of the several elements of weighing and labeling apparatus 10 in conjunction with computer 72, to include the operation of printer 40 located in housing 42 and printer 40 located in housing 73. As in FIG. 9, and FIG. 10, controller 31 also communicates with other stations and other areas of the plant.

Figure 12:
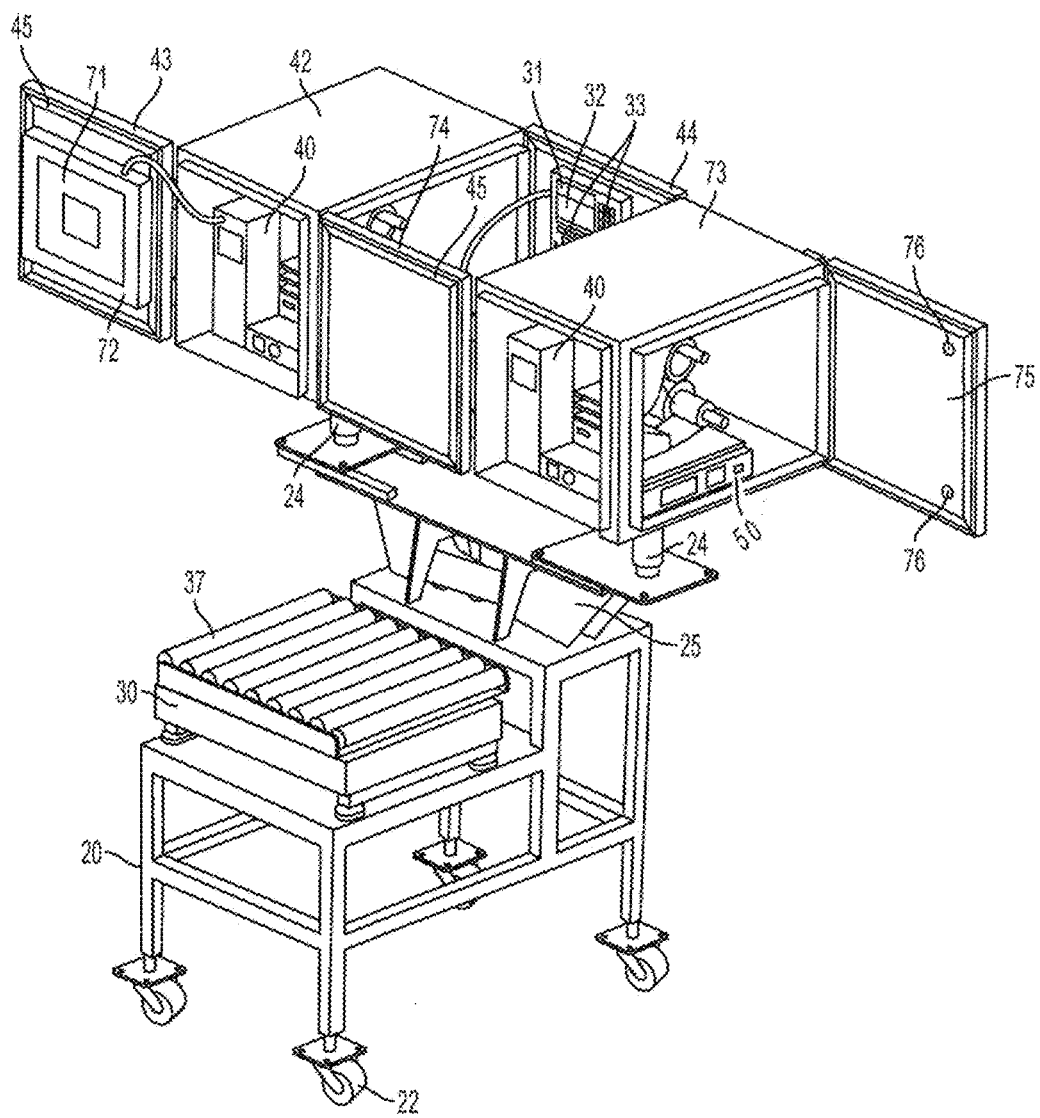
FIG. 12 is a front perspective view of an embodiment of the weighing and labeling apparatus with riser and dual rotatable, water-tight printer housings with side doors opened.

FIG. 12 is a front perspective view of an embodiment of the weighing and labeling apparatus with riser 24 supporting dual rotatable masts 24 and water-tight printer housings with side door 43, door 44, door 74 and 75 in an open configuration. Located on the internal surface of door 43 of printer housing 42 is computer 72, computer display 71. Located on the internals surface of door 44 of printer housing 42 is scale controller 31, scale display 32 and scale controls 33. Controller 31 coordinates the operation of the several elements of weighing and labeling apparatus 10 in conjunction with computer 72, to include the operation of printer 40 located in housing 42 and printer 40 located in housing 73. As in FIG. 9, FIG. 10, and FIG. 11, controller 31 in FIG. 12 also communicates with other stations and other areas of the plant. FIG. 12 also show rollers 37 that allow packages being weighed in an assembly line format to be easily weighed and moved to the next station. As in FIG. 9, FIG. 10, and FIG. 11, frame 20 supports water-tight printer housing 42 and water-tight printer housing 73, which can be fastened closed with door fasteners 76 in order to attain a closed door configuration of housing 42 and water-tight printer housing 73. Computer 72 and scale controller 31 interface in order to operate both printer 40 within housing 42 and printer 40 located in housing 73. The internal surface of door 74, door 75, door 43 and door 44 house gasket 45 in order to maintain a water-tight seal on doors 74, 75, 43, and 44 when in a closed configuration and fastened with door fasteners 76. FIG. 12 shows housing 42 and housing 73 mounted on rotatable mast 24 and riser 25. Rotatable mast 25 allows housing 42 and housing 73 to pivot and turn in order to allow an operator easy access to printer 40 and label feeder 50 located inside housing 42 and housing 73.

Figure 13:
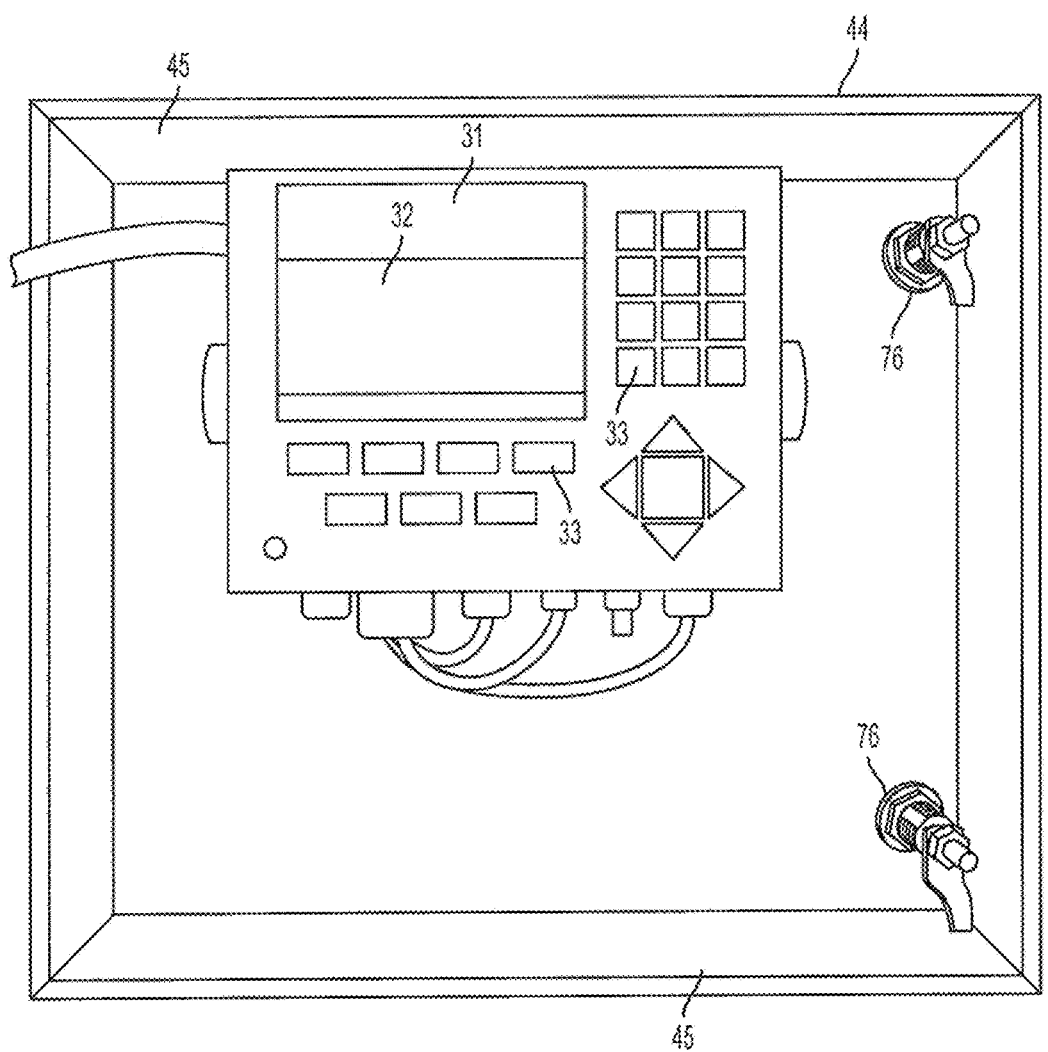
FIG. 13 is a front perspective view of the scale controller on an internal surface of a door of an embodiment of the weighing and labeling apparatus.

FIG. 13 is a front perspective view of the scale controller 31 located on an internal surface of door 44 of an embodiment of the weighing and labeling apparatus. Computer 72 and scale controller 31 interface in order to operate both printer 40 within housing 42 and printer 40 located in housing 73. Controller 31 coordinates the operation of the several elements of weighing and labeling apparatus 10 in conjunction with computer 72, to include the operation of printer 40 located in housing 42 and printer 40 located in housing 73. As in FIG. 1, FIG. 2, FIG. 3, FIG. 9, FIG. 10, FIG. 11, and FIG. 12, controller 31 in FIG. 13 also communicates with other stations and other areas of the plant. Scale controller 31 shows scale display 32, scale controls 33 on the front to set up and program scale 30. FIG. 13 also shows gasket 45 for sealing door 44 in a water-tight configuration when door 44 is in a closed configuration via door fasteners 76.

Figure 14:
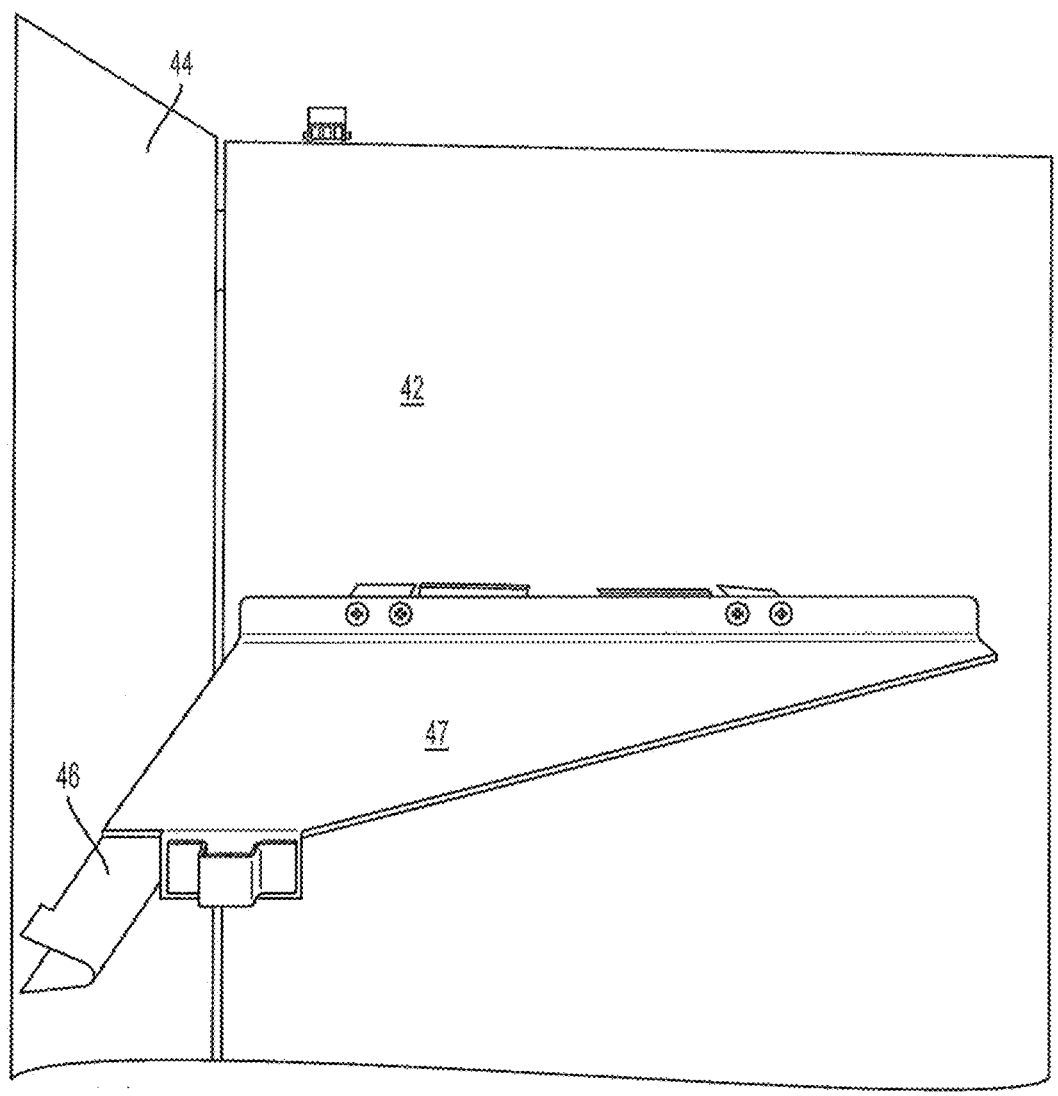
FIG. 14 is a rear side perspective view of a first and second door latch on an external surface of a door of an embodiment of the weighing and labeling apparatus maintaining the printer housing's doors in an open configuration.

FIG. 14 is a rear side perspective view of a first and second door latch on an external surface of door 44 of an embodiment of the weighing and labeling apparatus 10 maintaining printer housing 42 doors in an open configuration via door latch 46 and door latch 47.

Figure 15:
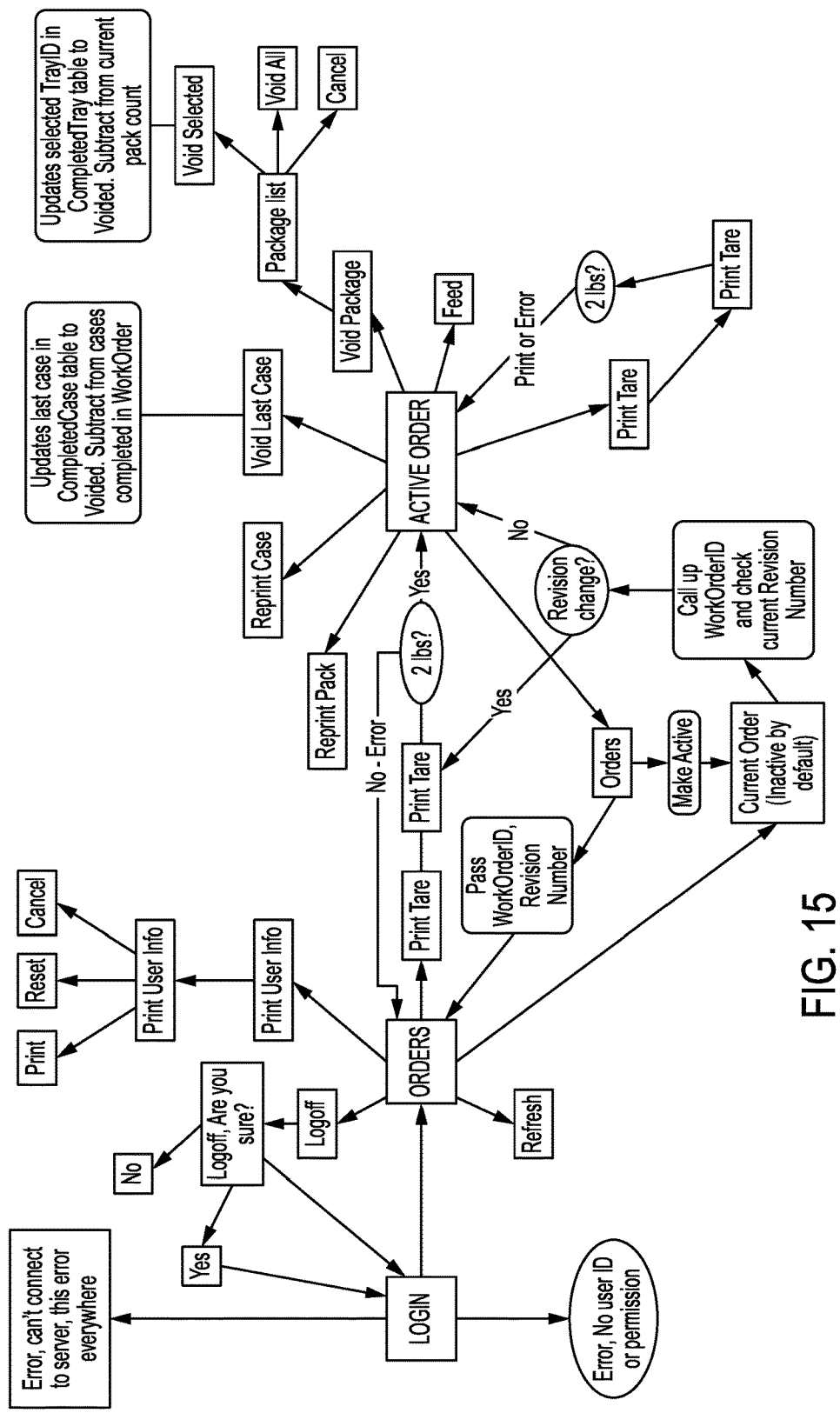
FIG. 15 is a flow chart showing the interaction of the operator, weighing and labeling apparatus, and the packing plant.

FIG. 15 is a flow chart showing the interaction of the operator, weighing and labeling apparatus 10, and the packing plant. In some embodiments, weighing and labeling apparatus 10 has very limited autonomy from the greater plant and receives most of the needed information automatically. Some embodiments of weighing and labeling apparatus 10 are programmed locally.

It is to be understood that the embodiments and claims are not limited in application to the details of construction and arrangement of the components set forth in the description and illustrated in the drawings. Rather, the description and the drawings provide examples of the embodiments envisioned, but the claims are not limited to any particular embodiment or a preferred embodiment disclosed and/or identified in the specification. The drawing figures are for illustrative purposes only, and merely provide practical examples of the invention disclosed herein. Therefore, the drawing figures should not be viewed as restricting the scope of the claims to what is depicted.

The embodiments and claims disclosed herein are further capable of other embodiments and of being practiced and carried out in various ways, including various combinations and sub-combinations of the features described above but that may not have been explicitly disclosed in specific combinations and sub-combinations. Accordingly, those skilled in the art will appreciate that the conception upon which the embodiments and claims are based may be readily utilized as a basis for the design of other structures, methods, and systems. In addition, it is to be understood that the phraseology and terminology employed herein are for the purposes of description and should not be regarded as limiting the claims.

We claim:

1. A weighing and labeling apparatus for packages, said apparatus comprising:
   a structural frame, said structural frame comprising a platform, mounted on vertical cylinders, said cylinders being infinitely adjustable;
   a scale for weighing packages, said scale located on said platform;
   a printer for printing labels, said printer located on said structural frame;
   a housing for said printer, said housing located on said structural frame;
   a computer for processing package information, said computer mounted in said housing;
   a label feeder for supplying labels, said label feeder located on said structural frame;
   a label applicator for affixing said labels to a package, said label applicator located on said structural frame; and
   a controller mounted on said structural frame and controlling said scale, said printer, said label feeder, and said label applicator.

2. The weighing and labeling apparatus for packages of claim 1, wherein:
   said label feeder feeds a label ribbon to said printer and further to said label applicator.

3. The weighing and labeling apparatus for packages of claim 1, wherein:
   said label applicator is mounted on said structural frame above said scale.

4. The weighing and labeling apparatus for packages of claim 1, wherein:
   said label applicator is powered by air.

5. The weighing and labeling apparatus for packages of claim 1, wherein:
   said controller on said structural frame further comprises a local operator interface.

6. The weighing and labeling apparatus for packages of claim 1, wherein:
   said computer for processing said package information communicates with said label printer via said controller.

7. The weighing and labeling apparatus for packages of claim 1, wherein:
   said package information comprises at least one of the following: package contents, package weight, package price per unit, package sell-by date information, and package vendor information.

* * * * *